US007580674B2

(12) United States Patent
Gorsuch et al.

(10) Patent No.: US 7,580,674 B2

(45) Date of Patent: Aug. 25, 2009

(54) INTELLIGENT INTERFACE FOR CONTROLLING AN ADAPTIVE ANTENNA ARRAY

(75) Inventors: Thomas E. Gorsuch, Indialantic, FL (US); John A. Regnier, Palm Bay, FL (US); John E. Hoffmann, Indialantic, FL (US); George Rodney Nelson, Jr., Merritt Island, FL (US); James A. Proctor, Jr., Melbourne Beach, FL (US)

(73) Assignee: IPR Licensing, Inc., Wilmington, DE (US)

( * ) Notice: Subject to any disclaimer, the term of this patent is extended or adjusted under 35 U.S.C. 154(b) by 0 days.

(21) Appl. No.: 10/378,565

(22) Filed: Mar. 3, 2003
(Under 37 CFR 1.47)

(65) Prior Publication Data

US 2004/0033817 A1 Feb. 19, 2004

Related U.S. Application Data

(60) Provisional application No. 60/361,418, filed on Mar. 1, 2002, provisional application No. 60/415,265, filed on Sep. 30, 2002.

(51) Int. Cl.

| | |
|---|---|
| ***H04B 7/14*** | (2006.01) |
| ***H04B 1/00*** | (2006.01) |
| ***H04B 15/00*** | (2006.01) |
| ***H04B 1/06*** | (2006.01) |
| ***H04B 7/00*** | (2006.01) |
| ***H04B 1/38*** | (2006.01) |
| ***H04B 7/212*** | (2006.01) |
| ***H04M 1/00*** | (2006.01) |
| ***H01Q 3/00*** | (2006.01) |
| ***H01Q 3/12*** | (2006.01) |
| ***H01Q 3/02*** | (2006.01) |
| ***G01S 5/04*** | (2006.01) |
| ***H03F 3/16*** | (2006.01) |

(52) U.S. Cl. .................... 455/25; 455/63.4; 455/277.2; 455/562.1; 370/347; 342/368; 342/372; 342/373; 342/374; 342/432; 330/277; 712/1; 375/346; 348/165; 348/180; 348/192

(58) Field of Classification Search ............. 455/562.1, 455/562.2, 107, 558, 557, 167.1, 575.7, 25, 455/63.4, 277.2; 343/702, 700 MS, 741, 343/792.5, 794, 799, 802, 834, 836, 837, 343/853; 370/347; 342/368, 372, 373, 374, 342/432

See application file for complete search history.

(56) References Cited

U.S. PATENT DOCUMENTS 3,806,930 A * 4/1974 Gobert ........................ 342/368
5,270,667 A * 12/1993 Upton ........................ 330/277
5,303,240 A * 4/1994 Borras et al. ................ 370/347

(Continued)

FOREIGN PATENT DOCUMENTS

EP 1 079 296 A2 2/2000

(Continued)

*Primary Examiner*—William D Cumming
(74) *Attorney, Agent, or Firm*—Volpe and Koenig PC

(57) ABSTRACT

An antenna control interface is integrated with common integrated circuit components, such as radio transceiver or baseband modem signal processing control logic. The antenna control interface controls the operation of an adaptive antenna array used with wireless communication system devices.

19 Claims, 5 Drawing Sheets

U.S. PATENT DOCUMENTS

| | | | | |
|---|---|---|---|---|
| 5,410,321 | A * | 4/1995 | Gordon et al. | 342/374 |
| 5,479,176 | A * | 12/1995 | Zavrel, Jr. | 342/374 |
| 5,581,258 | A * | 12/1996 | Arico | 342/165 |
| 5,610,617 | A * | 3/1997 | Gans et al. | 342/373 |
| 5,642,348 | A | 6/1997 | Barzegar et al. | |
| 5,708,458 | A | 1/1998 | Vrbanac | |
| 5,745,858 | A * | 4/1998 | Sato et al. | 455/562.1 |
| 5,754,588 | A | 5/1998 | Tanaka et al. | |
| 5,767,807 | A | 6/1998 | Pritchett | |
| 5,905,473 | A | 5/1999 | Taenzer | |
| 5,991,864 | A * | 11/1999 | Kinney et al. | 712/1 |
| 6,058,105 | A | 5/2000 | Hochwald et al. | |
| 6,100,843 | A * | 8/2000 | Proctor et al. | 342/368 |
| 6,121,925 | A * | 9/2000 | Hilliard | 342/432 |
| 6,292,153 | B1 | 9/2001 | Aiello et al. | |
| 6,304,215 | B1 * | 10/2001 | Proctor et al. | 342/372 |
| 6,317,092 | B1 | 11/2001 | de Schweinitz et al. | |
| 6,496,143 | B1 * | 12/2002 | Vail et al. | 342/372 |
| 6,515,635 | B2 | 2/2003 | Chiang et al. | |
| 6,573,862 | B2 * | 6/2003 | Vail et al. | 342/368 |
| 6,600,456 | B2 * | 7/2003 | Gothard et al. | 343/834 |
| 6,611,231 | B2 | 8/2003 | Crilly, Jr. et al. | |
| 6,980,782 | B1 * | 12/2005 | Braun et al. | 455/277.2 |
| 7,242,424 | B2 * | 7/2007 | Lee | 348/180 |
| 2002/0008672 | A1 | 1/2002 | Gothard et al. | |
| 2002/0083458 | A1 * | 6/2002 | Henderson et al. | 725/72 |
| 2004/0033817 | A1 * | 2/2004 | Gorsuch et al. | 455/562.1 |
| 2004/0183911 | A1 * | 9/2004 | Lee | 348/192 |
| 2004/0248517 | A1 * | 12/2004 | Reichgott et al. | 455/63.4 |
| 2004/0259597 | A1 | 12/2004 | Gothard et al. | |
| 2007/0236571 | A1 * | 10/2007 | Lee | 348/192 |
| 2008/0089452 | A1 * | 4/2008 | Henderson et al. | 375/346 |

FOREIGN PATENT DOCUMENTS

| | | | |
|---|---|---|---|
| EP | 1 079 296 | A2 * | 2/2001 |
| WO | WO 01/22643 | A | 3/2001 |
| WO | WO 01/63813 | A | 8/2001 |

* cited by examiner

INTELLIGENT INTERFACE FOR CONTROLLING AN ADAPTIVE ANTENNA ARRAY

This application claims priority to prior U.S. Provisional Patent Application Ser. No. 60/361,418 filed Mar. 1, 2002 entitled "ASIC Interface for Controlling Adaptive Antenna Array" and prior U.S. Provisional Patent Application Ser. No. 60/415,265 filed Sep. 30, 2002 entitled "Intelligent Interface for Controlling an Adaptive Antenna Array." The entire teachings of both prior provisional applications are hereby incorporated by reference.

BACKGROUND OF THE INVENTION

The present invention is related to antenna systems for use with wireless radio modems that may be used to provide a communication link for mobile computers.

The demand for use of data processing equipment continues to increase, including demand for not only desktop personal computers but also portable laptop computer and Personal Digital Assistant (PDA) devices. One undeniable trend in the proliferation of small data processing devices is the need to interconnect them—and the public increasingly desires to have the option of connecting them through wireless network devices. Certain of these devices make use of the existing cellular telephone network and a specialized radio modem that applies cellular compatible modulation to the baseband data signals. A number of existing and proposed systems, such as Cellular Digital Packet data (CDPD), General Purpose Radio Systems (GPRS), and even proposed data features of so-called Third Generation (3G) systems, are expected to provide this functionality.

Wireless local area networks (WLANs) however promise to be the most widely adopted type of wireless communication system. In this arrangement, each mobile computer typically uses a wireless modem card that can be in the format of the common Personal Computer Memory Card International Association (PCMCIA) interface. These credit card-size devices can be easily inserted into standardized slots placed in laptop and other portable computing equipment. Such PCMCIA cards then act as Network Interface Cards (NICs) to permit connection in a WLAN, such as to other, similarly equipped peer devices, or to a central wireless Access Point (AP), that may act as a gateway to other networks (e.g., to a wired connection to the Internet).

The most popular WLAN devices operate according to the various standards promulgated by the Institute of Electrical and Electronic Engineers (IEEE) as so-called "802.11a", "802.11b", "802.11g", "WiFi" and similar equipment. Such equipment is permitted to operate in the United States in unlicensed radio frequency bands at 2 GigaHertz (GHz) and 5 GHz ranges—and therein lies the reason why such devices are so popular. There is no need to configure or to pay monthly subscription fees to private service provider in order to obtain wireless data connectivity with WLAN devices.

PCMCIA cards used for WLAN communications necessarily include radio transmitters, radio receivers, modem processors, and other circuits needed for wireless communication, as well as some sort of antenna. Some of the available antenna configurations are quite compact, but most omnidirectional in their operation and permanently attached to the PCMCIA card.

Other antenna mechanisms exist in wireless modem configurations. However, these mechanisms typically control only a portion of, for example, a connection of a single transceiver to one of two antenna elements. Each of these antenna elements is simply an omni-directional element and not adapted to provide directionality or increased interference rejection.

SUMMARY OF THE INVENTION

The present invention can be embodied as an interface with control logic for controlling an adaptive antenna array used in a wireless data communication system. Specifically, an antenna control interface can be integrated with other component(s) of a wireless data radio and/or modem, e.g., WLAN modem device such as a PCMCIA card. The antenna control interface and wireless data modem components may be implemented in the PCMCIA card as an Application Specific Integrated Circuit (ASIC), Programmable Logic Array (PLA), Field Programmable Gate Array (FPGA), or Complex Programmable Logic Device (CPLD).

However, the antenna control interface may also be implemented in other electronic circuit form factors which are conveniently integrated with other portions of a WLAN device. For example, the antenna control interface may also be implemented using the general purpose input/output (GPIO) pins of a baseband signal processing chip or microcontroller processor.

The antenna control interface may also be integrated with portions of other data processing devices. For example, the antenna control interface may be provided in part by a data processing support device, such as a USB serial-to-parallel interface. In this configuration, the USB interface provides antenna control signals from/to the data processing device, which in turn coordinates control of the antenna or at least provides connectivity from the antenna controller. This configuration might typically be more generally applicable to both portable and desktop data processing equipment, as well as Access Point (AP) and other types of WLAN equipment that might not have PCMCIA interface slots and/or where special purpose PCMCIA cards are not feasible.

From an electrical functional perspective, a wireless data network device employing the principles of the present invention may integrate an antenna control interface with a technique for automatic detection of the presence and type of directional antenna to enable or disable an antenna steering algorithm. More specifically, control of the steerable antenna is accomplished through the antenna control interface using a number (N) of analog, serial, or parallel digital signal lines to determine the control state of the antenna elements in the array.

The antenna control interface can be implemented in a manner that permits automatic detection and presence of a directional antenna and the configuration and/or type of antenna. For example, the signals for the antenna control interface may originate from the control device as bi-directional signals. Each of the N digital signal lines may have a weak pull-down resistor to generate a logic 0 value when no external connection is present. The steerable antenna may include a pull-up resistor on each control line, such that a logic 1 value is generated when connected to the control device.

Thus, during a power-up sequence for the control device, or on a periodic basis, the control device may configure the N control lines as inputs and perform a read operation to determine the logic state for each control line. If, for example, all of the N control lines are a logic 0 then the steerable antenna is not connected. If, in the same example, any of the N control lines return a logic 1, then a steerable antenna is connected and the number of control lines that are at a logic 1 determine the antenna configuration. Opposite logic values may also be used to determine whether the steerable antenna is connected and to identify the antenna configuration.

The antenna steering algorithm can therefore be enabled if a steerable antenna is connected, in which case the antenna steering algorithm uses the antenna configuration data for proper antenna steering. Otherwise, the antenna steering algorithm is disabled if a steerable antenna is not connected.

In contrast, existing systems typically assume the presence of a specific type of steerable antenna. Other existing techniques require the use of user-configured jumpers to enable/disable the antenna steering algorithm. The invention, instead, may provide an automated method for proper configuration of the antenna steering algorithm and eliminate possible human error in the setting of configuration jumpers and/or switches that would otherwise need to be properly set by an end user.

The integration of the antenna control interface within the WLAN device also enables cost reductions while providing the flexibility of a single design that may or may not use the adaptive antenna array.

A wireless network device employing the principles of the present invention can be used in both Station (e.g., Subscriber) devices as well as in Access Point devices.

The antenna control interface may use a digital or analog control signal structure of relatively low complexity so that it may be controlled directly from the modem chip. It therefore provides for extremely low cost and is suitable for a high volume market, thereby permitting cost effective deployment of controllable antenna arrays that may be phased arrays, parasitic arrays, or other antenna arrays that exhibit directional properties.

The implementation may be adapted for various types of wireless devices, such as wireless local area network (WLAN), operating in accordance with, for example, the IEEE 802.11a, 802.11b, or 802.11g Standards, or so-called WiFi. However, the invention may also be adapted for use with other types of communication systems such as cellular (3G) High Data Rate (HDR), legacy Cellular Digital Packet data (CDPD), or General Packet Radio Service ("GPRS"), or other type of wireless data communication systems that can benefit from integrated control of directional antenna units.

Figure 1A:
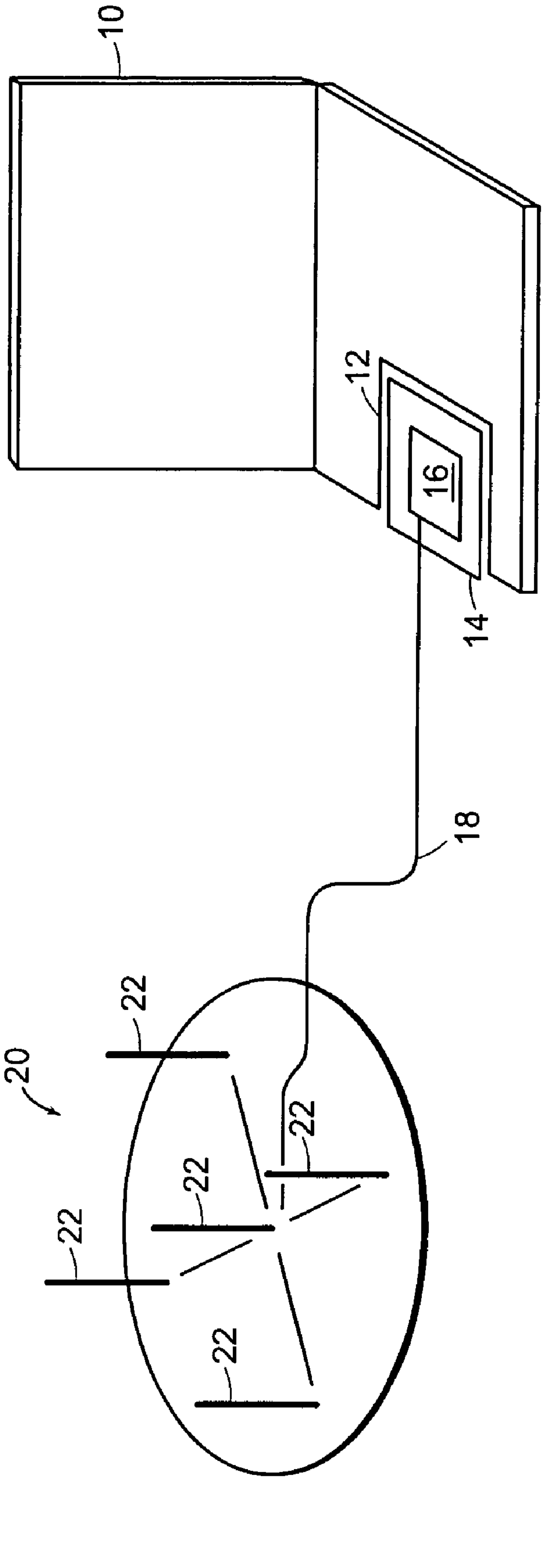
FIG. 1A is a view of a portable computing device that makes use of an interface for controlling an adaptive antenna array according to the present invention.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF A PREFERRED EMBODIMENT

A description of preferred embodiments of the invention follows.

FIG. 1A illustrates an arrangement whereby a portable computing device, such as a laptop computer 10, is communicating over a wireless data network using an adaptive antenna array 20. The laptop computer 10 has, in a preferred embodiment, a standardized peripheral slot 12, such as a Personal Computer Memory Card International Association (PCMCIA) compatible slot 12. The PCMCIA slot 12 has within it a PCMCIA modem card 14. The modem card 14, as will be understood in more detail shortly, includes (i) wireless data modem circuitry, (ii) an antenna control interface 16 for setting parameters for the controllable antenna array 20, as well as (iii) radio transmitter and receiver equipment. Of specific interest is the antenna control interface 16, which may be used to generate control signals that are used to control the parameters of the array 20. Such control signals, as well as radio frequency signals, pass between a PCMCIA card 14 and the antenna array 20 over a suitable cable 18. The cable 18, in turn, feeds both control and radio signals to two or more elements 22 of the antenna array 20.

By selecting certain states for digital control signals and/or certain voltages for analog control signals, the elements 22 of the antenna array 20 are placed in different states either by changing their impedance, in the case of a passive array 20, or by changing their phase or amplitude settings, in the case of a phased array 20.

One example of a configuration for a passive array using a central active element and surrounding reflective elements is described in our co-pending U.S. patent application Ser. No. 09/859,001 entitled "Adaptive Antenna For Use In Wireless Communication Systems," filed May 16, 2001 and assigned to Tantivy Communications, Inc., the assignee of the present application and which application is hereby incorporated by reference in its entirety. It should be understood, however, that other configurations of antenna arrays may utilize the present invention to their advantage, such as for a directional antenna assembly having passive antenna elements, where one passive antenna element at a time can be made active (see U.S. Pat. No. 6,515,635 entitled "Adaptive Antenna For Use In Wireless Communication Systems," issued Feb. 4, 2003, the entire teachings of which are incorporated herein by reference).

Figure 1B:
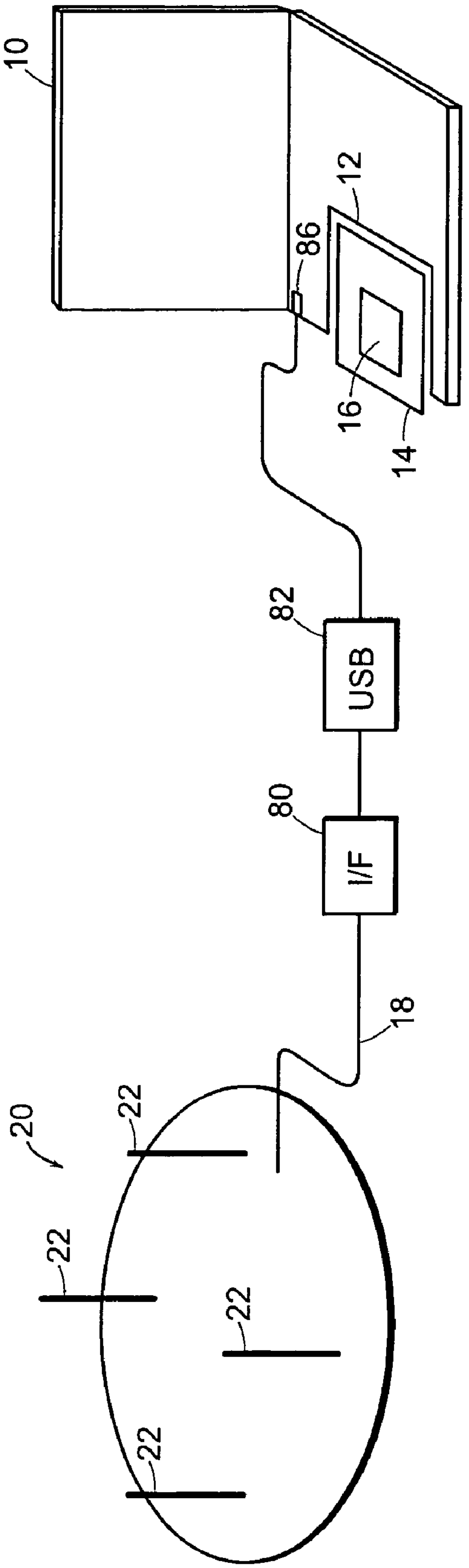
FIG. 1B is a view of an alternative arrangement of the portable computing device whereby access to the antenna array by the control signals is provided over a Universal Serial Bus (USB) port.
Figure 2:
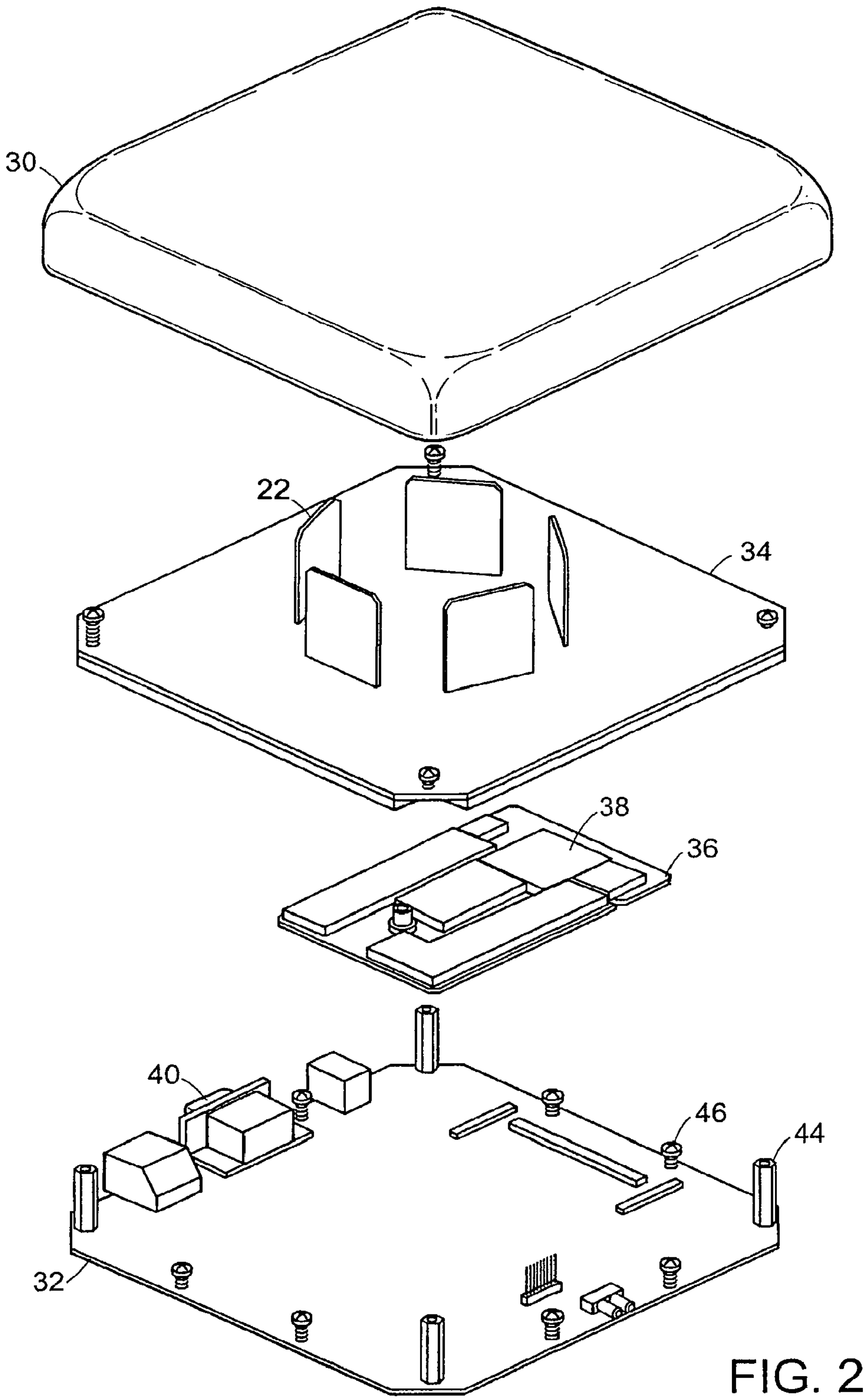
FIG. 2 is an isometric exploded view of a particular adaptive antenna array that may be utilized with the present invention.

FIG. 2 is a more detailed view of a mechanical configuration of one possible embodiment of the antenna array 20. The antenna array 20 may be physically embodied from a number of components, including a cover 30, a base 32, one or more support structures 34, and circuit boards 36. The support structure 34, which in the illustrated embodiment is a planar circuit board element, is used for supporting one or more antenna elements 22. In this embodiment, the antenna elements 22 are themselves formed on printed circuit. board pieces as conductive T-shaped strips oriented in it with a vertical orientation with respect to the mounting plane 34. The circuit board 36 may support circuitry 38, including, of most importance here, the antenna control interface 16 or other phase-weighting or other circuits that effect a change in the signal received from or transmitted to each of the individual antenna elements 22. Finally, the base 32 may include one or more connectors 40 for receiving the control signals from the cable 18 (FIG. 1), as well as mechanical mounting components, such as standoffs 44 and/or mounting screws 46, to hold the entire antenna array 20 assembly together.

Figure 3:
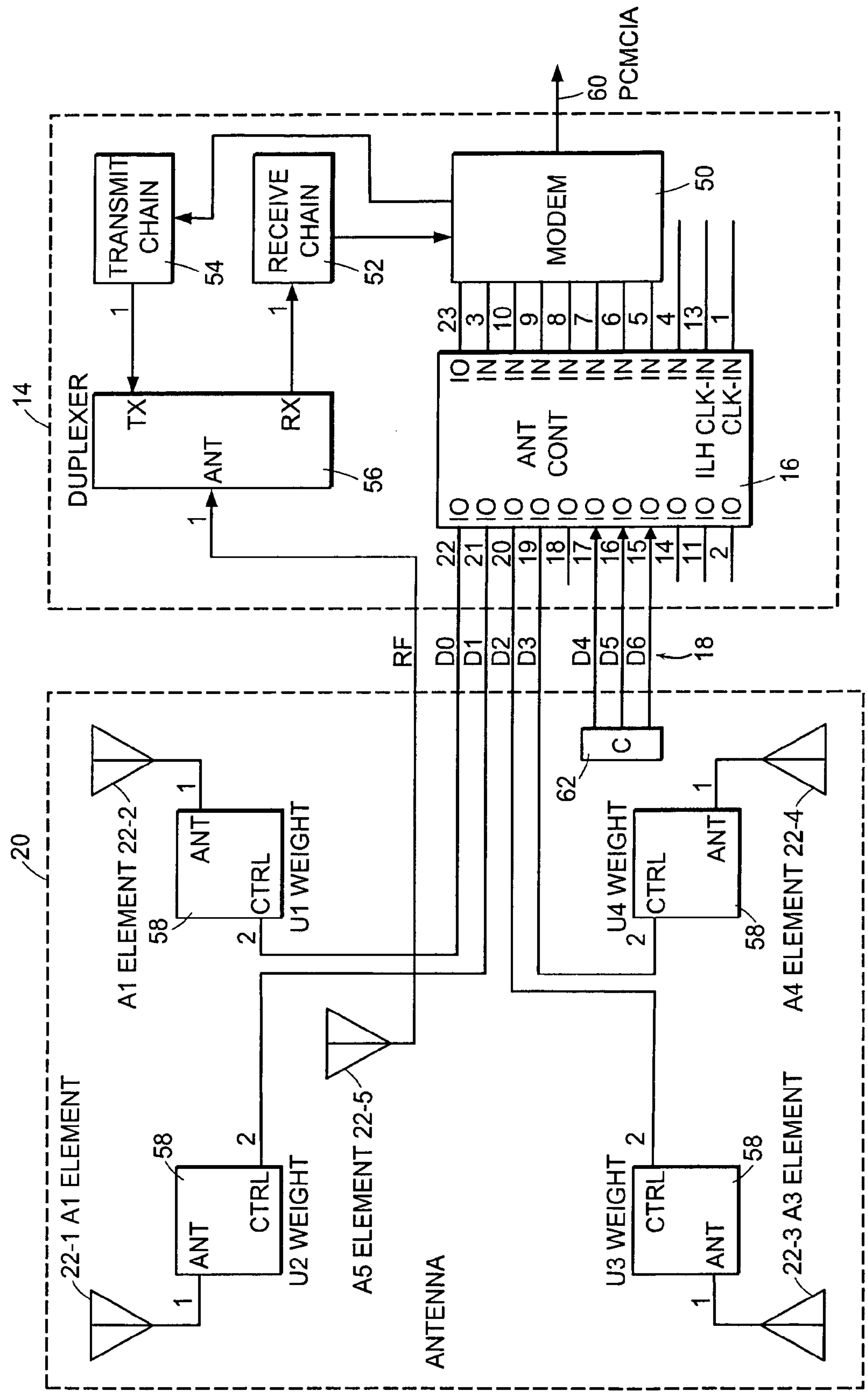
FIG. 3 is a detailed block diagram of one preferred embodiment of the antenna array interface.

FIG. 3 is a more detailed electrical diagram of the PCMCIA card 14 and the antenna array 20. The PCMCIA card 14 includes the antenna control interface 16, modem 50, receive chain circuitry 52, transmit chain circuitry 54, and duplexer 56. The PCMCIA card is a planar removable circuit board that may utilize a standardized computer interface, such as the PCMCIA interface 60.

In accordance with known techniques, digital computer signals representing data signals to be transmitted or received are coupled to the remainder of the computer equipment 10 via the PCMCIA interface 60. The modem 50 in the transmit direction formats these signals, modulating them in a manner that is consistent with their transmission over the particular wireless data network in use.

For example, in the case where a Wireless Local Area Network (WLAN) is being used to carry the data signals, the signals are formatted as spread spectrum, orthogonal frequency division, multiple access, radio signals as specified by the Institute of Electrical and Electronic Engineers (IEEE) 802.11(a), 802.11(b), or 802.11(g) standard. If the network is another type of wireless network, such as a General Packet Radio Service (GPRS) network, the signals might be time division multiplex access (TDMA)-type signals. In the case of a 3G-type network, they may be formatted in accordance with a code division multiple access (CDMA)-type modulation. What is important to realize here is that the specific type of wireless modulation is not important to the present invention.

In any event, the signal to be transmitted is fed to the transmit circuitry 54, which up-converts the signals to a proper radio frequency (RF) carrier, forwarding them to the duplexer 56. The duplexer at a transmit (TX) port receives the signal to be transmitted and outputs it at an antenna (ANT) port. The signal is then fed over one of the wires on the interface, such as a radio frequency (RF) signal wire, forwarding it to the antenna array 20. The signal is then fed to, in the illustrated embodiment, the center radiating A5 element 22-5 from which it is then radiated.

The antenna control interface 16 may be implemented in one or more circuit components that are preferably integrated with other portions of the wireless equipment. For example, the antenna control interface 16 may itself be an Application Specific Integrated Circuit (ASIC), Programmable Logic Array (PLA), Field Programmable Gate Array (FPGA), Complex Programmable Logic Device (CPLD). What is important to note here is that the antenna control interface 16 may be located on the same PCMCIA card 14 that contains the WLAN radio 52, 54, 56 and modem 50 circuits rather than in the antenna array assembly 20. It should be understood that the antenna control interface 16 may be located external from the PCMCIA card 14 and external from the antenna array assembly 20 and still be considered integrated with the other functional circuits.

In accordance with aspects of the particular preferred embodiment of the invention, the antenna control interface 16 may assign weights to each of the four antenna elements 22-1, 22-2, 22-3, and 22-4 to effect the resulting signal radiated by the array 20. For example, the weights applied may effect different connections, such as open or closed connections, between each respective element 22 and a ground or other voltage reference (not shown). Alternatively, the weight circuits 58 may apply a phase or amplitude to signals in other embodiments (that are not shown in FIG. 3).

The interface cable 18 thus carries one or more control signals (D0, D1, D2, D3) to control various aspects of the signal radiated by the antenna array 20 to each of one or more respective weight circuits 58. The control signals D0-D3 may be generated by circuitry on the antenna control interface 16 that is located on the same PCMCIA card 14 as the modem 50 radio transmitter and receivers 52 and 54, and other RF components 56 and the like.

In one embodiment, other signals D4, D5, and D6 provided on the cable 18 may be used as configuration signals that are fed from the antenna array 20 back to the antenna control interface 16. Specifically, these signals may be generated and/or sent through control circuitry 62 that is resident on the PC board 38 in the antenna array assembly 20. These control signals may provide configuration information back to the antenna control interface 16 so that it may make certain choices with regard to generating control signals D0-D3.

For example, the configuration signals D4-D6 may indicate the particular number of elements in the antenna array 20. This permits different configurations of antenna arrays to be applied to the same antenna control interface 16 and/or PCMCIA card 14 without the need to purchase and/or reconfigure different devices. The configuration signals D4-D6 also permit a way to provide for the antenna control interface 16 to automatically configure the array without user intervention. Other parameters, such as the number of angles in which the array may be set, can also be provided by the configuration signals D4-D6.

In a preferred embodiment, the communication is two-way so that signals are also received by the antenna array 20 at the elements 22 and combined as a function of the settings on the weighting circuitry 58 with the RF signal at the active element 22-5 in a manner as described in U.S. application Ser. No. 09/859,001, "Adaptive Antenna For Use in Wireless Communication Systems," filed May 16, 2001 incorporated herein by reference in its entirety. The signal is then fed over the cable 18 to the duplexer 56 at the ANT port and then to the receive port RX on the duplexer 56. From the duplexer 56, the signal is fed to the receive chain circuitry 52 and then to receive portions of the modem 50. The modem 50 may then remove the modulation from the received signals and forward them as data signals over the PCMCIA interface 60.

The present configuration also contemplates a process by which the interface 60 is used to control the antenna array 20. Specifically, in an initial state, an initial radio signal may be received by the antenna array 20, such as when configured in an omni-directional arrangement and fed over the RF line to the receiver 52. The receiver 52 forwarding the received radio signal to the modem 50, and hence to the antenna control interface 16, may determine certain parameters of a received radio signal, such as its signal strength. This, in turn, may cause the antenna control interface 16 to perform further processing, such as setting a new set of weights to be applied to the weighting circuits 58 via the forwarding digital or analog signals on the control lines D0-D3. The result is to reconfigure the array 20 so that when a next subsequent signal is received, it has been processed by the array 20 with the new settings.

We have thus seen how an integrated circuit, which typically provides only wireless modem functionality, may be augmented to provide an integrated control circuit to directly control the behavior of an adaptive antenna array 20. Specifically, control signals D0-D3 may be passed over the interface such that the control algorithms used to determine the values of such control signals are generated or performed by circuitry that is integrated on the same chipset as the modem 50 performing typical modem functions. This further permits the use of protocol-specific and/or link metric measurement functions integrated in the modem 50 to aid in the selection of the control signals D0-D3 that have passed through the cable 18.

It should be understood that the interface card 14 may include the control signals D0-D3 that may assume the form of a parallel set of digital bits to control the weights 58 in the case where the weights are on-off state devices, such as switches, coupling the passive elements to a reference voltage. In an alternative embodiment, the control signals may assume the form of analog signals, such as analog voltages, in the instance where the weights 58 are phase shifters, for example, or impedance parameters or adjustable amplitude parameters.

By integrating antenna control functions into a modem and/or at least the same interface card 14 which contains the modem functionality, high cost reduction and flexibility of a single design can be achieved. The design also permits utilizing one or more different antenna designs with the same modem interface circuit by simply integrating the control functions as a programmable entity that can sense configuration signals fed from the antenna array 20.

In another embodiment, separate interfaces may be provided for RF signals such that a transmit signal is fed on one connection and a receive signal is fed on another. Other configurations of mechanical connections between the antenna array 20 and the PCMCIA card 14 may be possible. For example, consider the arrangement of FIG. 1B. Here, the antenna control interface 16 is implemented on a PCMCIA card 14 as before. However, the interface cable 18 is not brought to the PCMCIA card 14. Rather, the antenna control signals are brought through an auxiliary interface such as a Universal Serial Bus (USB) port 86. In this embodiment, then, a USB interface 82 translates the USB signals into the controls signals suitable for use by the antenna array 20. Please note that additional circuits 80 may be provided in this embodiment, such as front end RF processing circuits.

It should also be understood that a PCMCIA card 14 is only one particular implementation for the antenna control interface 16 and that other mechanical and/or electrical configurations for the modem circuitry 50 and antenna control interface 16 are possible.

Figure 4:
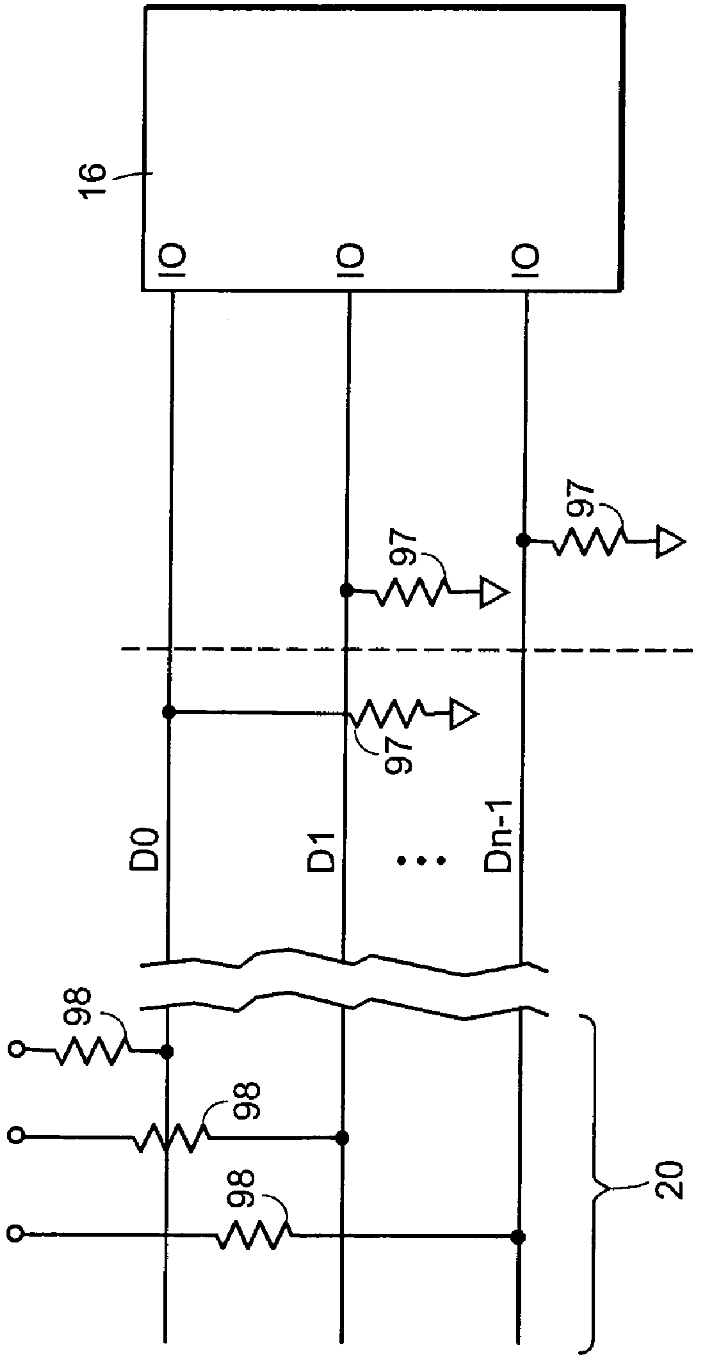
FIG. 4 illustrates a bi-directional implementation of the interface.

Turning attention now to FIG. 4, the antenna interface can be implemented in a manner that permits automatic detection and presence of a directional antenna and the configuration/type of antenna. The N control signal lines D0-$D_{N-1}$ for the interface originating from the antenna control interface 16 may be designed to be bi-directional. Here, each of the N digital signal lines has a corresponding weak pull-down resistor 97 to generate a logic 0 value when no external connection is present.

In addition, the steerable antenna module 20 contains a pull-up resistor on each control line D0-$D_{N-1}$, such that a logic 1 value is generated when the corresponding control line connected to the antenna control interface 16.

Thus, during a power-up sequence for the antenna control interface 16, or on a periodic basis, the antenna control interface 16 configures the N control lines as inputs and performs a read operation to determine the logic state for each control line. If all of the N control lines are a logic 0 then the steerable antenna is not connected. However, if any of the N control lines return a logic 1, then a steerable antenna is connected. The number of control lines that return a logic 1 can be used as an indication to determine the antenna configuration.

It should be understood that the logic 1 and logic 0 may be reversed to indicate antenna connection and configuration.

The antenna steering algorithm can therefore be enabled if a steerable antenna is connected, in which case the antenna steering algorithm uses the antenna configuration data for proper antenna steering. Otherwise, the antenna steering algorithm is disabled if a steerable antenna is not connected.

While this invention has been particularly shown and described with references to preferred embodiments thereof, it will be understood by those skilled in the art that various changes in form and details may be made therein without departing from the scope of the invention encompassed by the appended claims.

The invention claimed is:

1. A wireless device, comprising:

an antenna control interface integrated with other functional circuits of the device, the antenna control interface comprising:

a plurality of inputs, wherein each input is configured to receive a configuration signal from a particular associated antenna of an adaptive antenna array and wherein each configuration signal has either a first state indicating a presence of an associated particular antenna or a second state indicating an absence of an associated particular antenna; and a plurality of outputs, wherein each output is configured to provide a control signal to an associated antenna of the adaptive antenna array, and wherein the determination of the control signal for an associated antenna is based upon the received configuration signals for each particular antenna.

2. A device as in claim 1 wherein the antenna control interface includes a set of parallel bi-directional digital signal lines.

3. A device as in claim 1 wherein the antenna control interface includes at least one serial input/output signal line.

4. A device as in claim 1 wherein the antenna control interface includes a set of parallel analog input/output control signal lines.

5. A device as in claim 4 wherein the analog control signals control phase parameters of elements of the adaptive antenna array.

6. A device as in claim 4 wherein the analog control signals control amplitude parameters of elements of the antenna array.

7. A device as in claim 4 wherein the analog control signals control impedance parameters of elements of the antenna array.

8. A device as in claim 1 wherein the wireless data network is a Wireless Local Area Network.

9. A device as in claim 1 wherein the wireless data network is a cellular wireless network.

10. A device as in claim 1 wherein the antenna control interface is integrated on a circuit substrate with other wireless data access circuits.

11. A device as in claim 10 wherein the other wireless data access circuits comprise wireless radio transmitter/receiver circuits.

12. A device as in claim 10 wherein the other wireless data access circuits comprise wireless data modem circuits.

13. A device as in claim 1 wherein the wireless data network device is an Access Point in a Wireless Local Area Network.

14. A device as in claim 1 wherein the wireless data network device is a Station device.

15. A device as in claim 1 wherein the control interface and other wireless data components are implemented in a PCMCIA card.

16. A device as in claim 1 wherein the control interface is implemented as one of an Application Specific Integrated Circuit (ASIC), Programmable Logic Array (PLA), Field Programmable Gate Array (FPGA), or Complex Programmable Logic Device (CPLD).

17. A device as in claim 1 wherein the configuration signals are generated in part by pull-up or pull-down resistors to indicate the presence or absence of an antenna array, wherein when a particular antenna of the antenna array is present, an associated pull-up resistor indicates a first value for the associated configuration signal and when a particular antenna is absent, an associated pull-down resistor provides a second value for the associated configuration signal.

18. A device as in claim 1 wherein at least a subset of the configuration signals are control signals.

19. An antenna control system, comprising:

an adaptive antenna array including a plurality of antennas; and an antenna control interface in communication with the adaptive antenna array, wherein the antenna control interface is configured to receive a configuration signal associated with a state of each of the plurality of antennas, determine a control signal for the antenna array based upon the received configuration signals associated with each of the plurality of antennas, and configure the adaptive antenna array by outputting an associated control signal for each of the plurality of antennas in the adaptive antenna array.

* * * * *